(12) United States Patent
Asano

(10) Patent No.: US 7,602,593 B2
(45) Date of Patent: Oct. 13, 2009

(54) SEMICONDUCTOR DEVICE (75) Inventor: Shigetaka Asano, Kasugai (JP)

(73) Assignee: Fujitsu Microelectronics Limited, Tokyo (JP)

( * ) Notice: Subject to any disclaimer, the term of this patent is extended or adjusted under 35 U.S.C. 154(b) by 315 days.

(21) Appl. No.: 11/476,138

(22) Filed: Jun. 28, 2006

(65) Prior Publication Data
US 2007/0195483 A1 Aug. 23, 2007

(30) Foreign Application Priority Data
Feb. 20, 2006 (JP) ............................ 2006-042381

(51) Int. Cl.
*H02H 7/00* (2006.01)
(52) U.S. Cl. ...................................... 361/18
(58) Field of Classification Search ............... 361/15, 361/18
See application file for complete search history.

(56) References Cited
U.S. PATENT DOCUMENTS 7,205,813 B2 * 4/2007 Kang .......................... 327/287
7,276,979 B2 * 10/2007 Ishida et al. ................... 331/17
7,330,083 B2 * 2/2008 Matsuo et al. ............ 331/117 R

FOREIGN PATENT DOCUMENTS

| JP | 7-202072 A | 8/1995 |
|----|------------|--------|
| JP | 2001-175702 A | 6/2001 |
| JP | 2002-136103 A | 5/2002 |
| JP | 2002-158448 A | 5/2002 |
| JP | 2002-190640 A | 7/2002 |

* cited by examiner

*Primary Examiner*—Stephen W Jackson
(74) *Attorney, Agent, or Firm*—Fujitsu Patent Center (57) ABSTRACT

A semiconductor for suppressing power supply resonance caused by the external noise and preventing fluctuation of the power supply voltage. The semiconductor device includes first and second power supply wires for supplying power supply voltages, a variable capacitor circuit connected between the first and second power supply wires, a monitor circuit for detecting the fluctuation of the power supply voltage and generating an output signal indicating the detection thereof, and a controller for changing the capacitance value of the variable capacitor circuit based on the output signal of the monitor circuit.

15 Claims, 7 Drawing Sheets

SEMICONDUCTOR DEVICE

CROSS-REFERENCE TO RELATED APPLICATIONS

This application is based upon and claims the benefit of priority from the prior Japanese Patent Application No. 2006-042381, filed on Feb. 20, 2006, the entire contents of which are incorporated herein by reference.

BACKGROUND OF THE INVENTION

The present invention relates to a semiconductor device, and more particularly, to a semiconductor device for suppressing power supply resonance and for suppressing fluctuation in a power supply voltage.

Normally, an inductance component parasitizes the power supply wires in a semiconductor chip. A capacitor is arranged between a high potential power supply wire and a low potential power supply wire in the chip to stabilize the power supply voltage. When a resonance frequency based on the inductance component and the capacitor coincides with the frequency of noise propagating in the high potential power supply wire or the low potential power supply wire in the semiconductor device, power supply resonance occurs and causes large fluctuations in the power supply voltage. Therefore, power supply resonance caused by noise must be prevented.

Figure 1:
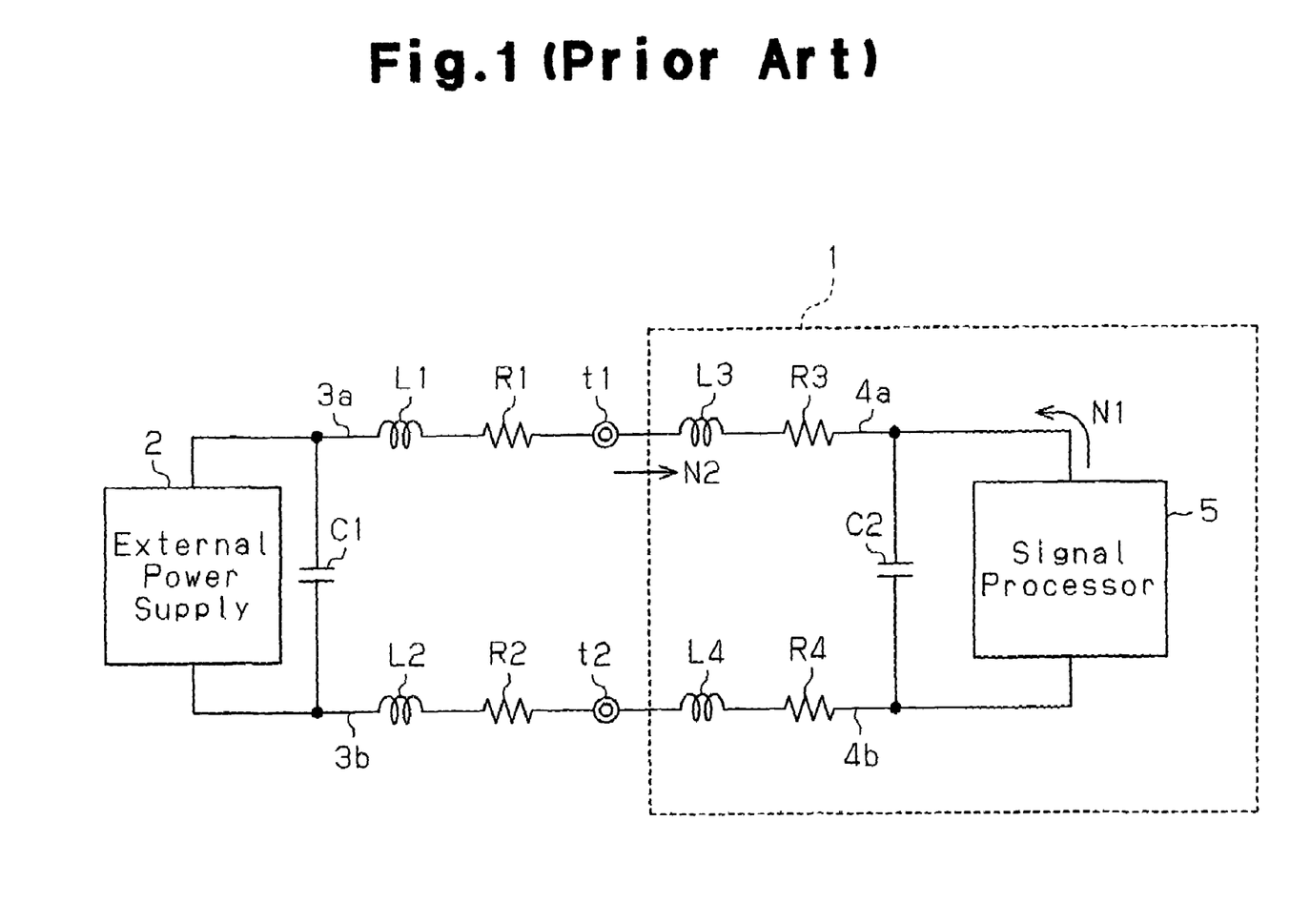
FIG. 1 is a schematic circuit block diagram of a semiconductor device in the prior art.

FIG. 1 is a schematic circuit block diagram of a conventional semiconductor device (chip 1). Power supply voltage is supplied from an external power supply 2 to power supply terminals t1 and t2 of the chip 1 via external wires 3a and 3b. The power supply voltage is then supplied to a signal processor 5 via internal wires 4a and 4b of the chip 1.

The external wires 3a and 3b include inductances L1 and L2 and resistors R1 and R2, respectively. The inductances L1 and L2 and the resistors R1 and R2 are actually distributed constants but are illustrated as concentrated constants in FIG. 1 for the sake of convenience. A capacitor C1 having a capacitance value of several μF to several tens of μF is connected between the output terminals of the external power supply 2 to stabilize the power supply voltage.

The internal wires 4a and 4b include inductances L3 and L4 and resistors R3 and R4, respectively. The inductances L3 and L4 and the resistors R3 and R4 are actually distributed constants but are illustrated as concentrated constants in FIG. 1. A capacitor C2 is connected between the internal wires 4a and 4b to stabilize the power supply voltage. Most of the components of the inductances L3 and L4 parasitize an interposer and bonding wire of the IC package.

With the above chip 1, when the resonance frequency of the inductances L3 and L4 and the capacitor C2 coincide with the frequency of internal noise N1 propagating from the signal processor 5 to the internal wire 4a (or 4b), power supply resonance occurs and the power supply voltage fluctuates.

Thus, the capacitance value of the capacitor C2 is set so that the resonance frequency of the inductances L3 and L4 and the capacitor C2 does not coincide with the frequency of the internal noise N1. The capacitor C2 attenuates the high frequency noise N1 output from the signal processor 5.

External noise N2 may be applied to the power supply terminals t1 and t2 via the external wires 3a and 3b. Power supply resonance also occurs and fluctuates the power supply voltage when the frequency of the noise N2 coincides with the resonance frequency of the inductances L3 and L4 of the internal wires 4a and 4b and the capacitor C2.

The connection of a capacitor between the internal wires 4a and 4b near the power supply terminals t1 and t2 in order to attenuate high frequency external noise N2 has thus been proposed.

However, it is difficult to arrange the capacitor near the power supply terminals t1 and t2 in a highly integrated chip 1. Thus, the capacitor is arranged between the signal processor 5 and the power supply terminals t1 and t2 to absorb the external noise N2 between the internal wires 4a and 4b.

The frequency of the external noise N2 is determined in a state in which the chip 1 is mounted on a circuit board (e.g., printed circuit board). Thus, the frequency of the external noise N2 cannot be specified during the design stage of the chip 1. If power supply resonance occurs after the mounting of the chip 1, the chip 1 must be re-designed to suppress power supply resonance.

Japanese Laid-Open Patent Publication No. 2002-158448 discloses a multi-layer wiring substrate for reducing EMI noise by connecting a plurality of incorporated capacitors, which correspond to different resonance frequencies, in parallel. The capacitance value of each incorporated capacitor is controlled so that an anti-resonance frequency of each incorporated capacitor does not coincide with the frequency of a high frequency component contained in an electric signal.

Japanese Laid-Open Patent Publication No. 2002-190640 (see FIG. 1b) discloses a laser oscillator power supply device provided with a resonance switch for forming a resonance circuit in accordance with the operation of the switch.

Japanese Laid-Open Patent Publication No. 2001-175702 discloses a circuit designing method for reducing power supply noise by arranging a bypass capacitor having an optimum capacitance value at an optimum position and adjusting the resonance frequency.

Japanese Laid-Open Patent Publication No. 7-202072 discloses a semiconductor device for suppressing the power supply noise in a wide frequency band by forming a plurality of capacitors having different capacitance values in a package and setting a plurality of resonance frequencies with a bypass capacitor and a conductor inductance.

Japanese Laid-Open Patent Publication No. 2002-136103 discloses a power supply system for reducing power consumption by arranging a plurality of capacitors between an output terminal of a voltage power supply conversion circuit and ground. A capacitor having a large capacity is connected in a continuous operation mode for continuously outputting power supply voltage and disconnected in an intermittent operation mode for intermittently outputting the power supply voltage.

SUMMARY OF THE INVENTION

The chip 1 shown in FIG. 1 is designed so that the resonance frequency of the inductances L3 and L4 and the capacitor C2 does not coincide with the frequency of the internal noise N1. This prevents power supply resonance caused by the internal noise N1. However, the frequency of the external noise N2 is not specified when designing the chip 1. Thus, the occurrence of power supply resonance caused by the external noise N2 cannot be prevented.

The present invention provides a semiconductor device that prevents power supply resonance caused by external noise and prevents the fluctuation of the power supply voltage.

One aspect of the present invention is a semiconductor device including first and second power supply wires for supplying power supply voltage. A variable capacitor circuit is connected between the first and second power supply wires.

A monitor circuit detects fluctuation in the power supply voltage and generates an output signal indicating detection thereof. A controller, connected to the variable capacitor circuit and the monitor circuit, changes capacitance value of the variable capacitor circuit based-on the output signal of the monitor circuit.

Another aspect of the present invention is a semiconductor device including first and second power supply wires for supplying power supply voltage. Third and fourth power supply wires, each arranged independent from the first and second power supply wires, supply the power supply voltage. A first variable capacitor circuit is connected between the first and second power supply wires. A second variable capacitor circuit is connected between the third and fourth power supply wires. A first monitor circuit for detecting fluctuation of the power supply voltage supplied via the first and second power supply wires and generating a first output signal indicating detection thereof. A second monitor circuit for detecting fluctuation of the power supply voltage supplied via the third and fourth power supply wires and generating a second output signal indicating the detection. A controller, connected to the first and second variable capacitor circuits and the first and second monitor circuits, for separately changing capacitance value of each of the first and second variable capacitor circuits based on the first and second output signals.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

In the drawings, like numerals are used for like elements throughout.

Figure 2:
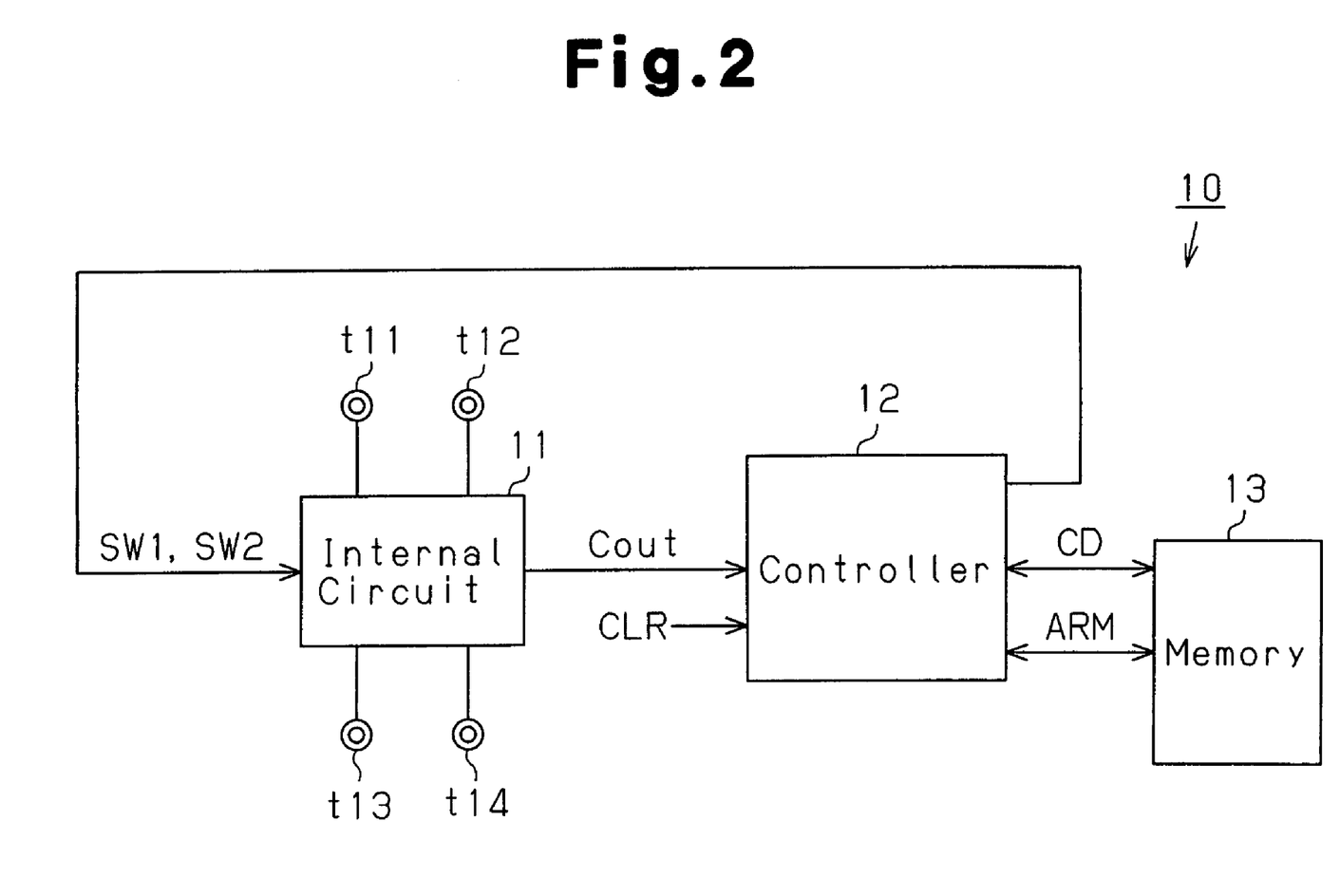
FIG. 2 is a schematic circuit block diagram of a semiconductor device according to a first embodiment of the present invention.

FIG. 2 is a schematic circuit block diagram of a semiconductor device 10 according to a first embodiment of the present invention. The semiconductor device 10 includes an internal circuit 11, a controller 12, and a memory 13. The memory 13 is configured by a non-volatile memory that holds the stored contents even when the supply of power is cut off.

Figure 3:
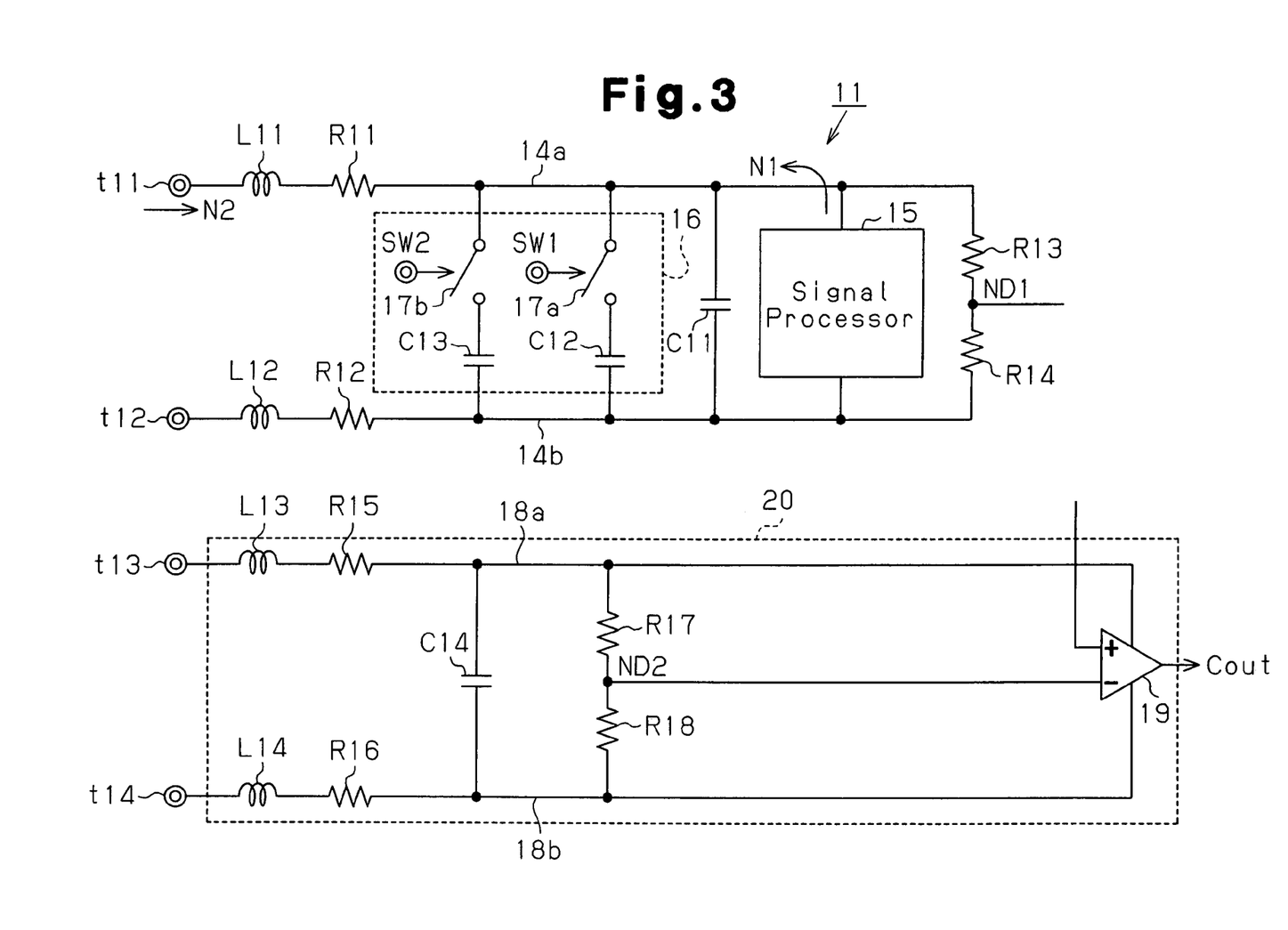
FIG. 3 is a schematic circuit block diagram of an internal circuit of the semiconductor device of FIG. 2.

FIG. 3 shows one example of the internal circuit 11. High potential power supply voltage of, for example, 3 V is supplied to the power supply terminal t11, and ground voltage (0 V) is supplied to the power supply terminal t12 as low potential power supply voltage. The power supply terminals t11 and t12 are respectively connected to a signal processor 15 by power supply wires 14a and 14b (first and second power supply wires) so that the high potential power supply voltage and the low potential power supply voltage are supplied to the signal processor 15.

The power supply wire 14a includes an inductance L11 and a resistor R11, and the power supply wire 14b includes an inductance L12 and a resistor R12. The inductances L11 and L12 and the resistors R11 and R12 are actually distributed constants but are illustrated as concentrated constants in FIG. 3 for the sake of convenience.

A capacitor C11 (first fixed capacitor) is connected between the power supply wires 14a and 14b near the signal processor 15 to stabilize the power supply voltage. The capacitance value of the capacitor C11 is set so that the resonance frequency of the inductances L11 and L12 and the capacitor C11 does not coincide with the frequency of the internal noised N1 output from the signal processor 15. The capacitance value of the capacitor C11 is set to 50 pF in the first embodiment.

A variable capacitor circuit 16 is connected in parallel to the capacitor C11 between the power supply wires 14a and 14b. The variable capacitor circuit 16 changes its capacitance value to adjust the resonance frequency of the inductances L11 and L12, the capacitor C11, and the variable capacitor circuit 16.

Specifically, the variable capacitor circuit 16 includes a capacitor C12 having a first terminal connected to the power supply wire 14b and a second terminal connected to the power supply wire 14a via a switch 17a. The variable capacitor circuit 16 further includes a capacitor C13 having a first terminal connected to the power supply wire 14b and a second terminal connected to the power supply wire 14a via a switch 17b. In other words, the variable capacitor circuit 16 includes a first set of the capacitor C12 and the switch 17a and a second set of the capacitor C13 and the switch 17b, with each set being connected in parallel between the power supply wires 14a and 14b. In the first embodiment, the capacitance value of the capacitor C12 is set to 10 pF, and the capacitance value of the capacitor C13 is set to 20 pF. The switches 17a and 17b are respectively activated and inactivated by single bit control signals SW1 and SW2 provided from the controller 12. The control signal SW1 corresponds to the lower rank bit of control data CD having two bits, and the control signal SW2 corresponds to the higher rank bit of the control data CD.

The switches 17a and 17b are respectively activated when the control signals SW1 and SW2 have an L level and inactivated when the control signal SW1 and SW2 have an H level.

Therefore, the state of the switches 17a and 17b is controlled to be in one of four states, namely, states in which both switches 17a and 17b are activated, only the switch 17a is inactivated, only the switch 17b is inactivated, and both switches 17a and 17b are inactivated.

Accordingly, the capacitance value of the variable capacitor circuit 16 is set to one of 0 pF, 10 pF, 20 pF, and 30 pF. Further, the total capacitance value of the capacitor C11 and the variable capacitor circuit 16 is set to one of 50 pF, 60 pF, 70 pF, and 80 pF.

Series-connected resistors R13 and R14 are connected in parallel to the signal processor 15 between the power supply wires 14a and 14b. In the first embodiment, for example, the resistor R13 is set to have 100 kΩ, and the resistor R14 is set to have 200 kΩ. Therefore, the potential at node ND1, which is a connection point of the resistors R13 and R14, is set to be 2 V, whereas the potential is 3 V at the power supply terminal t11.

The internal circuit 11 further includes a monitor circuit 20. The monitor circuit 20 detects the occurrence of power supply resonance caused by external noise N2 in the power supply voltage supplied to the power supply wires 14a and 14b.

In the same manner as the power supply terminals t11 and t12, high potential power supply voltage of 3 V and ground voltage of 0 V are respectively supplied to power supply terminals t13 and t14 of the monitor circuit 20. The power supply voltages supplied to the power supply terminal t13 and t14 are supplied to a comparator 19 by power supply wires 18a and 18b (first and second monitor power supply wires).

The power supply wire 18a includes an inductance L13 and a resistor R15 having substantially the same values as the inductance L11 and the resistor R11 of the power supply wire 14a. The power supply wire 18b includes an inductance L14 and a resistor R16 having substantially the same values as the inductance L12 and the resistor R12 of the power supply wire 14b. The inductances L13 and L14 and the resistors R15 and R16 are actually distributed constants but are illustrated as concentrated constants in FIG. 3.

A capacitor C14 (second fixed capacitor) is connected between the power supply wires 18a and 18b near the comparator 19 to stabilize the power supply voltage. The capacitance value of the capacitor C14 is set to be sufficiently lower than the capacitor Cd1, which is located near the signal processor 15. In the first embodiment, the capacitance value of the capacitor C14 is set to be, for example, 0.1 pF. Therefore, power supply resonance caused by external noises N2 having the same frequency does not occur in the power supply wires 18a and 18b at the same time as in the power supply wires 14a and 14b.

Resistors R17 and R18 (reference resistor) are connected in series between the power supply wires 18a and 18b near the comparator 19. In the first embodiment, for example, the resistor R17 is set to have 50 kΩ and the resistor R18 is set to have 200 kΩ. Therefore, the potential at node ND2 between the resistors R17 and R18 is set to 2.4 V when there is no power supply resonance in the power supply wires 18a and 18b.

Node ND2 is connected to a negative input terminal of the comparator 19. A positive input terminal of the comparator 19 is connected to node ND1. The comparator 19 generates an output signal Cout having an H level when the potential at the node ND1 becomes greater than the potential at the node ND2.

Therefore, the comparator 19 generates the output signal Cout having an L level when there is no power supply resonance in the power supply wires 14a, 14b, and 18a, 18b since node ND1 has 2 V and node ND2 has 2.4 V.

The comparator 19 generates the output signal Cout having an H level when power supply resonance occurs in the power supply wires 14a and 14b and the potential at the node ND1 changes to voltage exceeding 2.4 V, that is, when the potential at the power supply wire 14a exceeds 3.6V.

In the internal circuit 11, the resonance frequency f of each power supply wire 14a and 14b, 18a and 18b is calculated from the equation of $f=1/(2\pi\sqrt{(LC)})$. Assuming that the inductances L11, L12, and L13, L14 of 4 nH parasitizes the power supply wires 14a, 14b, and 18a, 18b, the resonance frequency f is approximately 199 MHz in the power supply wires 14a and 14b when both switches 17a and 17b are activated and the capacitance value between the power supply wires 14a and 14b is set to 80 pF.

The resonance frequency f becomes approximately 213 MHz when the switch 17a is inactivated and the capacitance value between the power supply wires 14a and 14b is set to 70 pF. Further, the resonance frequency f becomes approximately 230 MHz when the switch 17b is inactivated and the capacitance value between the power supply wires 14a and 14b is set to 60 pF. Moreover, the resonance frequency f becomes approximately 252 MHz when both switches 17a and 17b are inactivated and the capacitance value between the power supply wires 14a and 14b is set to 50 pF.

The resonance frequency f is set to 5.6 GHz in the power supply wires 18a and 18b since the capacitance value between the wires 18a and 18b is 0.1 pF. The resonance frequency of the power supply wires 14a and 14b thus does not coincide with the resonance frequency of the power supply wires 18a and 18b. Therefore, power supply resonance caused by common external noise N2 does not occur in the power supply wires 14a and 14b at the same times as in the power supply wires 18a and 18b.

The output signal Cout of the comparator 19 is provided to the controller 12. The controller 12 switches the activated and inactivated states of the switches 17a and 17b to suppress power supply resonance when provided with the output signal Cout having an H level from the comparator 19, that is, when power supply resonance occurs in the power supply wires 14a and 14b.

When power supply resonance is suppressed and the output signal Cout of the comparator 19 falls to an L level, the controller 12 stores the double bit control data CD, which sets the state of the switches 17a and 17b, in a predetermined region of the memory 13. If power supply resonance is not suppressed even switching the activated and inactivated states of the switches 17a and 17b, the controller 12 stores alarm data ARM in a predetermined region of the memory 13. Further, when a clear signal CLR is provided from an external device (e.g., microcomputer), which is not shown in the drawings, the controller 12 resets the control data CD to "00", resets the alarm data ARM to "0", and sets "1" for clear data CLRD (not shown in FIG. 2).

Figure 4:
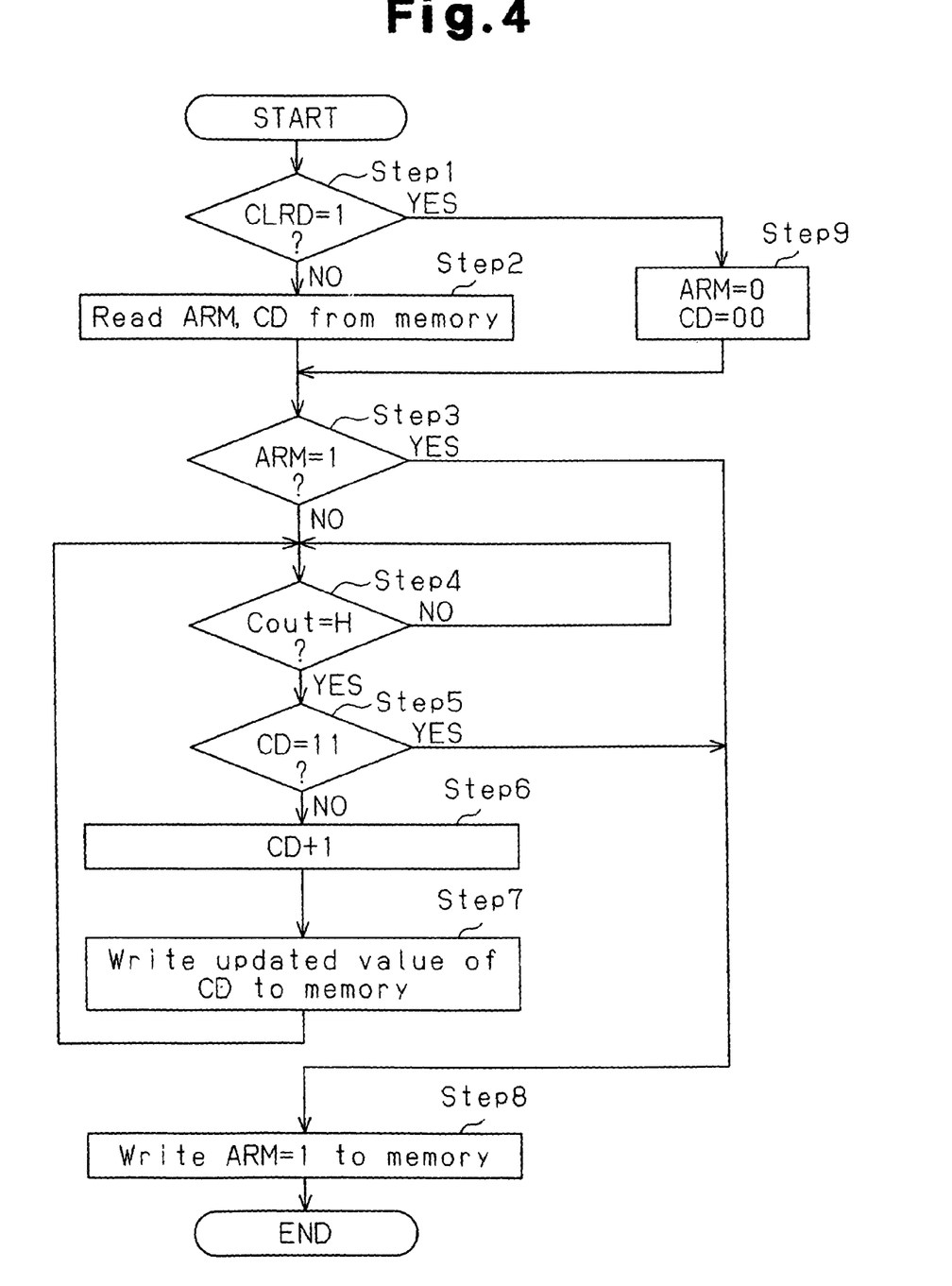
FIG. 4 is a flowchart showing the operation of a controller in the semiconductor device of FIG. 2.

The operation of the controller 12 will now be described with reference to FIG. 4. The controller 12 resets the memory 13 when first activated subsequent to mounting of the chip (semiconductor device 10). That is, the controller 12 resets the alarm data ARM to "0" and resets the control data CD to "00".

When normal operation starts, the controller 12 first determines whether or not the clear data CLRD is "1" (step 1). If the clear data CLRD is not "1", the controller 12 reads the control data CD and the alarm data ARM from the memory 13 and provides the internal circuit 11 with the control signals SW1 and SW2 corresponding to the control data CD (step 2).

Since the control data CD is "00", the switches 17a and 17b of the internal circuit 11 are both activated and the capacitance value between the power supply wires 14a and 14b is set to 80 pF.

The controller 12 then determines whether or not the read alarm data ARM is "1" (step 3). If the alarm data ARM is not "1", the controller 12 then determines whether or not the output signal Cout of the comparator 19 has an H level (step 4). If the output signal Cout of the comparator 19 has an L level, the controller 12 continues the determination of the output signal Cout in step 4.

If the output signal Cout of the comparator 19 has an H level, that is, if power supply resonance caused by external noise N2 is occurring in the power supply wires 14a and 14b in step 4, the controller 12 determines whether or not the control data CD is "11" (step 5). Since the control data CD is "00", the controller 12 proceeds to step 6. In step 6, the controller 12 adds 1 to the control data CD of "00" and generates the control data CD of "01" (step 6).

As the control signal SW1 is set to an H level in accordance with the updated control data CD, the switch 17a is inactivated and the capacitance value between the power supply wires 14a and 14b is changed to 70 pF.

Subsequently, the controller 12 writes the updated control data CD of "01" to the memory 13 (step 7) and proceeds to step 4. The controller 12 starts to continue the determination of the output signal Cout again in step 4 if the power supply resonance in the power supply wires 14a and 14b is resolved and the output signal Cout of the comparator 19 falls to an L level.

If the output signal Cout of the comparator 19 remains at an H level regardless of the change in the capacitance value, the power supply resonance has not been resolved. Thus, the controller 12 proceeds to step 5 and then step 6. The controller 12 further adds 1 to the control data CD of "01" to generate the control data CD of "10".

As the control signal SW2 is set to an H level and the control signal SW1 is set to an L level in accordance with the updated control data CD, the switch 17a is activated, the switch 17b is inactivated, and the capacitance value between the power supply wires 14a and 14b is changed to 60 pF.

The controller 12 then writes the control data CD, which has been updated to "10", in step 7 to the memory 13 and proceeds to step 4.

If the output signal Cout of the comparator 19 remains at an H level regardless of the change in the capacitance value, the power supply resonance has not been resolved. Thus, the controller 12 repeats steps 5 to 7. That is, the controller 12 adds 1 to the control data CD of "10" again to generate the control data CD of "11" and writes the control data CD to the memory 13. The capacitance value between the power supply wires 14a and 14b is then changed to 50 pF.

If the power supply resonance has not been-resolved even though the capacitance value has been changed to 50 pF, the controller 12 determines that the control data CD is "11" in step 5 and proceeds to step 8. The controller 12 sets the alarm data ARM to "1" and writes the alarm data ARM to the memory 13 in step 8. Then, the controller 12 terminates the processes for determining and resolving power supply resonance.

Further, if the clear data CLRD is "1" in step 1, the controller 12 proceeds to step 9. The controller 12 resets the alarm data ARM to "0" and resets the control data CD to "00" in step 9 and then proceeds to step 3.

The clear data CLRD is set to "1" when the clear signal CLR is provided to the controller 12. The clear signal CLR is provided when power supply resonance caused by the external noise N2 is not resolved even though the capacitance value is changed. In this case, a new capacitor is provided between the power supply wires 14a and 14b in addition to the capacitor C11 and the capacitors C12, C13. Power supply resonance caused by the external noise N2 is resolved by repeating steps 3 to 7.

The semiconductor device 10 of the first embodiment has the advantages described below.

(1) The monitor circuit 20 detects whether or not power supply resonance is occurring in the power supply wires 14a and 14b that supply power to the signal processor 15. When the monitor circuit 20 detects power supply resonance, the controller 12 changes the capacitance value of the variable capacitor circuit 16 between the power supply wires 14a and 14b and to resolve the power supply resonance. This suppresses the power supply resonance caused by the external noise N2 and prevents the power supply voltage from fluctuating.

(2) The two capacitors C12 and C13, which have different capacitance values, are connected in parallel between the power supply wires 14a and 14b by the switches 17a and 17b in the variable capacitor circuit 16. The switches 17a and 17b are each activated and inactivated in response to the single bit control signals SW1 and SW2. This enables the capacitance value between the power supply wires 14a and 14b to be changed among four values.

(3) The alarm data ARM is stored in the memory 13 if power supply resonance cannot be resolved even though the variable capacitor circuit 16 changes the capacitance value. Therefore, the controller 12 may recognize that power supply resonance caused by external noise N2 has not been resolved by reading the alarm data ARM.

(4) The control data CD for setting the capacitance value required to resolve power supply resonance is stored in the memory 13. Therefore, during reactivation of the system (semiconductor device 10), the capacitance value required to resolve power supply resonance is readily set based on the control data CD set during the previous activation.

Figure 5:
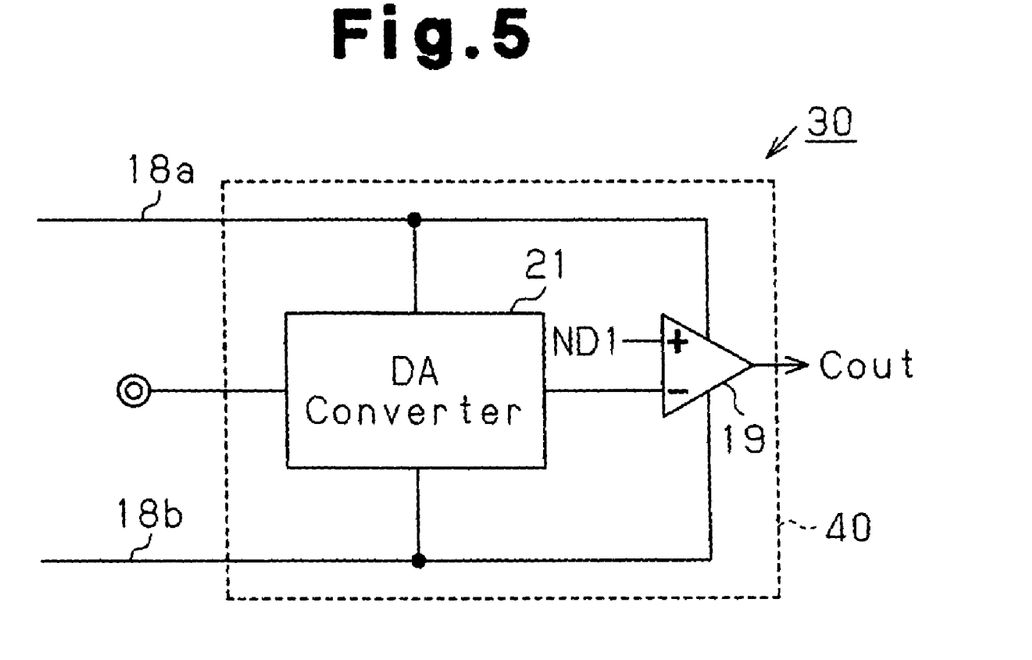
FIG. 5 is a schematic circuit block diagram of a monitor circuit in a semiconductor device according to a second embodiment of the present invention.

FIG. 5 is a schematic circuit block diagram of a monitor circuit 40 in a semiconductor device 30 according to a second embodiment of the present invention. In the second embodiment, the monitor circuit 20 (see FIG. 3) of the first embodiment is replaced by the monitor circuit 40. The monitor circuit 40 includes a DA converter 21 for generating reference voltage, which is supplied to the comparator 19. Although not shown in FIG. 5, the semiconductor device 30 also includes other components such as the controller 12, the memory 13, the signal processor 15, the variable capacitor circuit 16, in the same manner as in the first embodiment.

An output signal of the DA converter 21 is provided to the negative input terminal of the comparator 19. A digital input signal is provided to the DA converter 21 from an external device (not shown) such as a microcomputer. The positive input terminal of the comparator 19 is connected to node ND1 (see FIG. 3) in the same manner as in the first embodiment.

In the second embodiment, the reference voltage (analog voltage) supplied to the comparator 19 may be freely set by adjusting the digital input signal provided to the DA converter 21. Therefore, the reference voltage for determining the occurrence of power supply resonance in the power supply wires 14a and 14b may be set as required.

Figure 6:
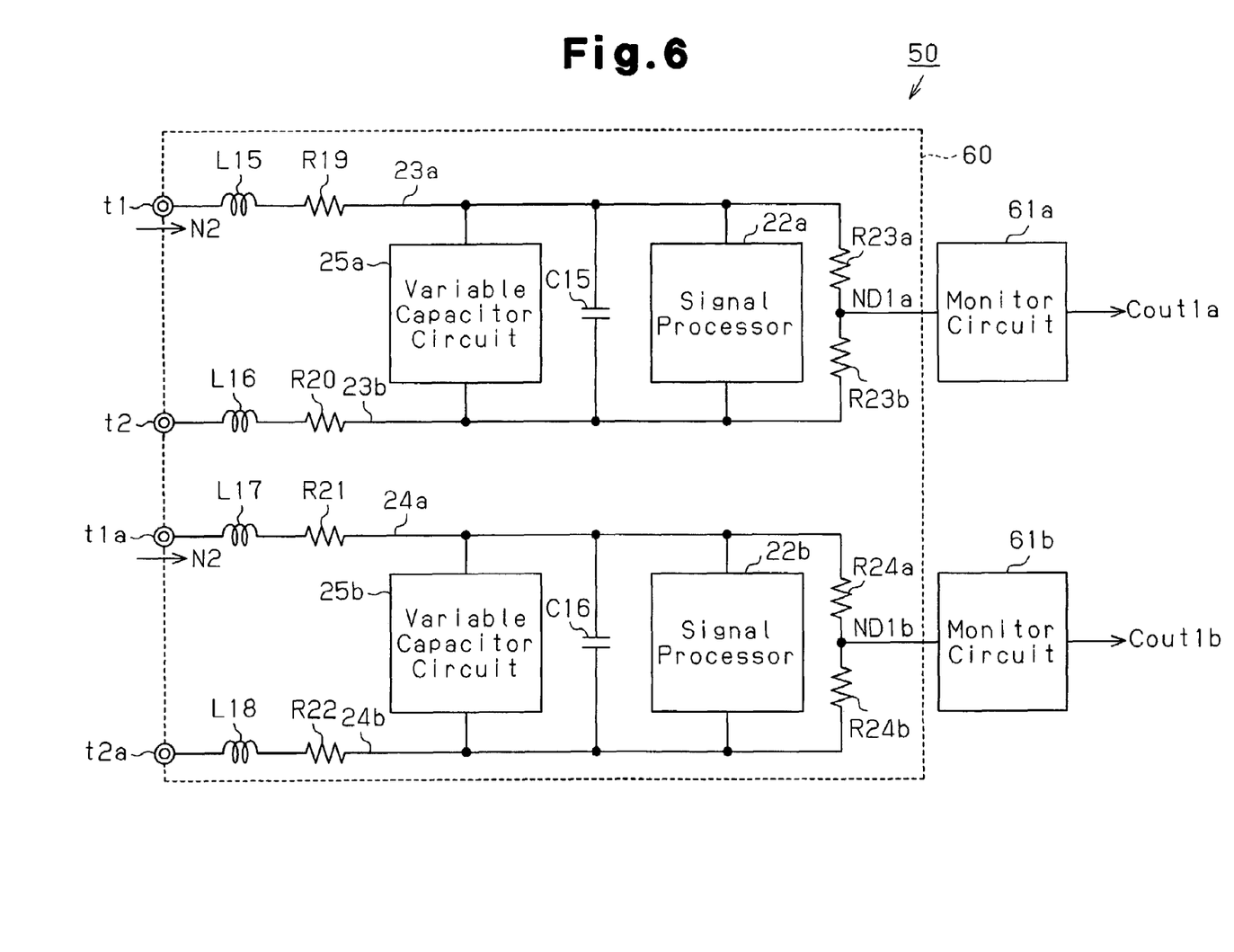
FIG. 6 is a schematic circuit block diagram of an internal circuit in a semiconductor device according to a third embodiment of the present invention.

FIG. 6 is a schematic block circuit diagram of an internal circuit 60 in a semiconductor device 50 according to a third embodiment of the present invention. The internal circuit 60 includes two signal processors 22a and 22b in the third embodiment. Although not shown in FIG. 6, the semiconductor device 50 also includes other components such as the controller 12 and the memory 13 in the same manner as in the first embodiment.

Power supply voltages (3 V and 0 V) are supplied to the signal processor 22a from power supply terminals t1 and t2 via power supply wires 23a and 23b (first and second power supply wires). The power supply voltages (3 V and 0 V) are supplied to the signal processor 22b from power supply terminals t1a and t2a via power supply wires 24a and 24b (third and fourth power supply wires). The power supply wires 23a and 23b are arranged independent from the power supply wires 24a and 24b. Inductances L15, L16, L17, and L18 and resistors R19, R20, R21, and R22 parasitize the power supply wires 23a, 23b, 24a, and 24b, respectively.

A capacitor C15 (fixed capacitor) and a variable capacitor circuit 25a are arranged in parallel between the power supply wires 23a and 23b to stabilize the power supply voltage. Further, a capacitor C16 (fixed capacitor) and a variable capacitor circuit 25b are arranged in parallel between the power supply wires 24a and 24b to stabilize the power supply voltage. The variable capacitor circuits 25a and 25b are each configured to be similar to the variable capacitor circuit 16 of the first embodiment.

Since the power supply wires 23a, 23b, 24a, and 24b are independent from each other, the inductances L15, L16, L17, and L18 parasitizing the power supply wires 23a, 23b, 24a, and 24b also differ from each other. The frequency of power supply resonance caused by external noise N2 in the power supply wires 23a and 23b differ from the frequency of power supply resonance caused by external noise N2 in the power supply wires 24a and 24b.

Therefore, the semiconductor device 50 of the third embodiment includes a first monitor circuit 61a for detecting the occurrence of power supply resonance in the power supply wires 23a and 23b, and a second monitor circuit 61b for detecting the occurrence of power supply resonance in the power supply wires 24a and 24b. The monitor circuits 61a and 61b are each configured to be similar to the monitor circuit 20 of the first embodiment. More specifically, the monitor circuit 61a compares the potential at node ND1a between the resistors R23a and R23b with the reference voltage to generate an output signal Cout1a indicating the comparison result. The monitor circuit 61b compares the potential at the node ND1b between the resistors R24a and R24b with the reference voltage to generate an output signal Cout1b indicating the comparison result. The controller 12 then separately controls the capacitance values of the variable capacitor circuits 25a and 25b based on the output signals Cout1a and Cbut1b of the monitor circuits 61a and 61b.

As a result, in the third embodiment, power supply resonance occurring in the power supply wires 23a and 23b connected to the signal processor 22a is suppressed based on the capacitance value set in the variable capacitor circuit 25a. Further, power supply resonance occurring in the power supply wires 24a and 24b connected to the signal processor 22b is suppressed based on the capacitance value set in the variable capacitor circuit 25b.

Figure 7:
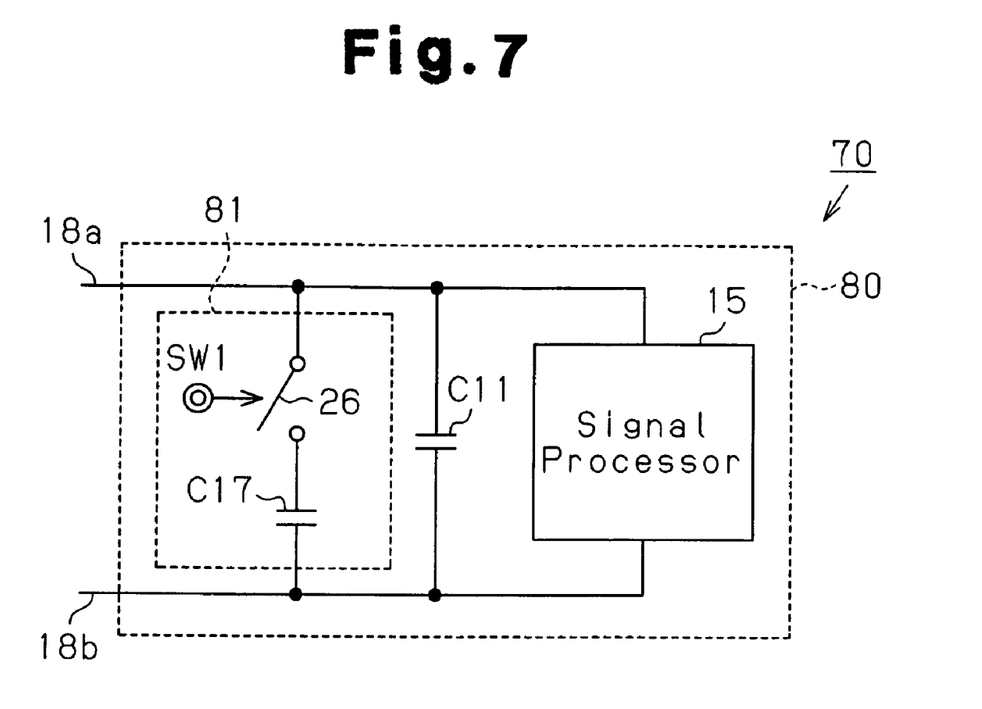
FIG. 7 is a schematic circuit block diagram of an internal circuit in a semiconductor device according to a fourth embodiment of the present invention.

FIG. 7 is a schematic block circuit diagram of an internal circuit 80 in a semiconductor device 70 according to a fourth embodiment of the present invention. In the internal circuit 80 of the fourth embodiment, the variable capacitor circuit 16 of the first embodiment is replaced by a variable capacitor circuit 81. Although not shown in FIG. 7, the internal circuit 80 includes a monitor circuit similar to the monitor circuit 20 of the first embodiment (or the monitor circuit 40 of the second embodiment). The semiconductor device 70 also includes other components such as the controller 12 and the memory 13 in the same manner as the first embodiment.

As shown in FIG. 7, the variable capacitor circuit 81 includes a set of a capacitor C17 and a switch 26 connected between the power supply wires 18a and 18b. The capacitor C17 and the switch 26 are connected in series. The switch 26 is activated and inactivated in response to a single bit control signal SW1 from the controller 12. The capacitor C17 is electrically connected to the power supply wires 18a and 18b when the switch 26 is activated and disconnected when the switch 26 is inactivated.

Therefore, in the fourth embodiment, the value of the capacitor connected between the power supply wires 18a and 18b is set to either the value of the capacitor C11 or the total value of the capacitors C11 and C17. That is, if the power supply resonance caused by external noise N2 is not resolved with only the capacitor C11, the switch 26 is activated so that the power supply resonance is resolved based on the total value of the capacitors C41 and C17. In the fourth embodiment, power supply resonance is resolved while minimizing the area occupied by the variable capacitor circuit 81 in the semiconductor device 70.

It should be apparent to those skilled in the art that the present invention may be embodied in many other specific forms without departing from the spirit or scope of the invention. Particularly, it should be understood that the present invention may be embodied in the following forms.

The comparator 19 need not be configured as in the manner of each of the above embodiments. For example, a comparator may be configured so that it detects power supply resonance when the potential at node ND1 becomes less than the potential at node ND2.

In the first embodiment, the capacitance values of the capacitors C12 and C13 of the variable capacitor circuit 16 may be the same.

In the first embodiment, the variable capacitor circuit 16 may include three or more sets of a capacitor and switch, which are connected in series between the power supply wires 14a and 14b, with each set connected in parallel between the power supply wires 14a and 14b.

The monitor circuits 61a and 61b of the third embodiment may be configured to be similar to the monitor circuit 40 of the second embodiment.

In the first embodiment, the capacitor C11 may be omitted, and power supply resonance may be suppressed only with the variable capacitor circuit 16. In the third embodiment, the capacitors C15 and C16 may be omitted, and power supply resonance may be suppressed with only the variable capacitor circuits 25a and 25b.

The present examples and embodiments are to be considered as illustrative and not restrictive, and the invention is not to be limited to the details given herein, but may be modified within the scope and equivalence of the appended claims.

What is claimed is:

1. A semiconductor device comprising:
   first and second power supply wires to supply power supply voltage;
   a variable capacitor circuit connected to each of the first power supply wire and the second power supply wire;
   a monitor circuit to detect fluctuation in the power supply voltage and generating an output signal indicating detection thereof; and
   a controller, connected to the variable capacitor circuit and the monitor circuit, to change capacitance value of the variable capacitor circuit based on the output signal of the monitor circuit.

2. The semiconductor device according to claim 1, wherein the controller generates alarm data when fluctuation of the power supply voltage is not suppressed even though the capacitance value of the variable capacitor circuit is changed.

3. The semiconductor device according to claim 1, wherein:
   the controller generates control data to change the capacitance value of the variable capacitor circuit; and
   the variable capacitor circuit includes one or more sets of a switch and a capacitor connected between the first and second power supply wires, the switch being activated and inactivated based on the control data, and the capacitor being electrically connected to the first and second power supply wires by the corresponding switch when the switch is activated.

4. The semiconductor device according to claim 3, wherein:
the one or more sets includes a first set of a first switch and a first capacitor and a second set, connected in parallel with the first set, of a second switch and a second capacitor; and
the first and second capacitors have different capacitance values.

5. The semiconductor device according to claim 1, further comprising:
a fixed capacitor having a constant capacitance value connected in series between the first and second power supply wires.

6. The semiconductor device according to claim 1, further comprising:
a first node, located between the first and second power supply wires, to supply comparison voltage to the monitor circuit, wherein the monitor circuit includes a comparator to detect fluctuation of the power supply voltage by comparing the comparison voltage and a reference voltage and generating the output signal indicating detection thereof.

7. The semiconductor device according to claim 6, further comprising:
a plurality of resistors connected in series between the first and second power supply wires, wherein the first node is located between the plurality of resistors.

8. The semiconductor device according to claim 6, wherein the monitor circuit includes:
first and second monitor power supply wires to supply the comparator with the power supply voltage; and
a plurality of reference resistors connected in series between the first and second monitor power supply wires, wherein a second node for supplying the reference voltage to the monitor circuit is located between the plurality of reference resistors.

9. The semiconductor device according to claim 8, further comprising:
a first fixed capacitor having a constant capacitance value connected in series between the first and second power supply wires, wherein the monitor circuit includes a second fixed capacitor having a constant capacitance value and connected between the first and second monitor power supply wires, the second fixed capacitor having a capacitance value less than the first fixed capacitor.

10. The semiconductor device according to claim 6, wherein:
the monitor circuit includes first and second monitor power supply wires connected to the comparator and having a resonance frequency differing from the first and second power supply wires; and
the comparator is supplied with the power supply voltage via the first and second monitor power supply wires, and the reference voltage is generated by dividing the power supply voltages supplied via the first and second monitor power supply wires.

11. The semiconductor device according to claim 6, wherein the monitor circuit includes a DA converter, connected to the comparator, to generate the reference voltage of an analog value from a digital input signal provided from an external device.

12. The semiconductor device according to claim 3, further comprising:
a memory, connected to the controller, to store the control data.

13. The semiconductor device according to claim 12, wherein:
the control data has one or more bits corresponding to the number of the one or more sets; and
the controller changes the value of the bit corresponding to the switch of which activation and inactivation is to be switched based on the output signal of the monitor circuit.

14. The semiconductor device according to claim 12, wherein the controller receives a clear signal for resetting the control data from an external device.

15. A semiconductor device comprising:
first and second power supply wires to supply power supply voltage;
third and fourth power supply wires, each arranged independent from the first and second power supply wires, to supply the power supply voltage;
a first variable capacitor circuit connected between the first and second power supply wires;
a second variable capacitor circuit connected between the third and fourth power supply wires;
a first monitor circuit to detect fluctuation of the power supply voltage supplied via the first and second power supply wires and to generate a first output signal indicating detection thereof;
a second monitor circuit to detect fluctuation of the power supply voltage supplied via the third and fourth power supply wires and to generate a second output signal indicating the detection; and
a controller, connected to the first and second variable capacitor circuits and the first and second monitor circuits, to separately change capacitance value of each of the first and second variable capacitor circuits based on the first and second output signals.

* * * * *